United States Patent
Nagata et al.

(10) Patent No.: US 10,290,829 B2
(45) Date of Patent: May 14, 2019

(54) FLEXIBLE ORGANIC ELECTROLUMINESCENT DEVICE INCLUDING SEALING LAYER

(71) Applicant: Japan Display Inc., Tokyo (JP)

(72) Inventors: Tetsuya Nagata, Tokyo (JP); Hiraaki Kokame, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/372,598

(22) Filed: Dec. 8, 2016

(65) Prior Publication Data
US 2017/0279073 A1 Sep. 28, 2017

(30) Foreign Application Priority Data
Mar. 23, 2016 (JP) .................. 2016-058533

(51) Int. Cl.
*H01L 51/52* (2006.01)
*H01L 27/32* (2006.01)
*H01L 51/00* (2006.01)

(52) U.S. Cl.
CPC ...... *H01L 51/5246* (2013.01); *H01L 27/3244* (2013.01); *H01L 51/0097* (2013.01); *H01L 51/5253* (2013.01); *H01L 51/5237* (2013.01); *H01L 2251/5338* (2013.01)

(58) Field of Classification Search
CPC .............. H01L 51/5237; H01L 51/524; H01L 51/5246; H01L 51/5253; H01L 51/5256; H01L 27/3244; H01L 2251/5338
See application file for complete search history.

(56) References Cited

U.S. PATENT DOCUMENTS

| | | | | |
|---|---|---|---|---|
| 2014/0152174 A1* | 6/2014 | Wang | .................. | H01L 51/5253 313/511 |
| 2015/0037916 A1* | 2/2015 | Rohatgi | ................ | H01L 51/524 438/28 |
| 2016/0218320 A1* | 7/2016 | Chen | .................... | H01L 51/5256 |
| 2016/0226021 A1* | 8/2016 | Lee | ..................... | H01L 51/5253 |
| 2017/0117504 A1* | 4/2017 | Kim | .................... | H01L 27/3244 |

FOREIGN PATENT DOCUMENTS

JP    2010-027561 A    2/2010

* cited by examiner

*Primary Examiner* — Thao X Le
*Assistant Examiner* — Gardner W. S. Swan
(74) *Attorney, Agent, or Firm* — Typha IP LLC

(57) ABSTRACT

A display device is disclosed including an array substrate including a plurality of pixels arranged in a display region, the display region including a planar region and a curved region, and a sealing layer covering the plurality of pixels and arranged across the display region, wherein the sealing layer includes a first organic insulation layer and a second organic insulation layer, a film thickness of the first organic insulation layer is more than a film thickness of the second organic insulation layer in the planar region, a film thickness of the second organic insulation layer is more than a film thickness of the first organic insulation layer in the curved region, and a hardness of the second organic insulation layer is lower than a hardness of the first organic insulation layer.

9 Claims, 9 Drawing Sheets

FLEXIBLE ORGANIC ELECTROLUMINESCENT DEVICE INCLUDING SEALING LAYER

CROSS REFERENCE TO RELATED APPLICATIONS

This application is based upon and claims the benefit of priority from the prior Japanese Patent Application No. 2016-058533, filed on Mar. 23, 2016, the entire contents of which are incorporated herein by reference.

FIELD

The present invention is related to an organic electroluminescence (referred to herein as organic EL) display device.

BACKGROUND

An organic EL display device is arranged with a light emitting element in each pixel and displays an image by individually controlling the emitted light. A light emitting element includes a structure in which a layer (referred to herein as [light emitting layer]) including an organic EL material is sandwiched between a pair of electrodes distinguished as an anode and cathode. When electrons are injected from the cathode and holes are injected from the anode, the electrons and holes recombine in the light emission layer. In this way, light emitting atoms within the light emission layer are excited by an excess of discharged energy and then de-excited and thereby light is emitted.

In the organic EL display device, the anode in each light emitting element is arranged as a pixel electrode in each pixel and the cathode is arranged as a common electrode which bridges a plurality of pixels and is applied with a common voltage. The organic EL display device controls the light emitted by a pixel by applying the voltage of the pixel electrode to each pixel with respect to the voltage of the common electrode.

However, a light emitting layer of an organic EL display device easily degrades when infiltrated by water which leads to the occurrence of non-lit regions called dark spots. In order to solve such problems, a sealing film is arranged in many organic EL display devices in order to prevent the infiltration of water (For example, Japanese Laid Open Patent Publication 2010-027561).

In recent years, flexible display devices are being actively developed having a display region which can be bent. While a sealing layer arranged in a flexible display device has high barrier properties when arranged at high density, there is a problem whereby cracks easily occur when bent. Since cracks which occur in a sealing film can lead to an infiltration path for water, reliability of a display device decreases.

One aim of the present invention is to provide a display device with improved resistance to bending of the display device while maintaining a sealing function.

SUMMARY

A display device is according to one embodiment of the present invention includes an array substrate including a plurality of pixels arranged in a display region, the display region including a planar region and a curved region, and a sealing layer covering the plurality of pixels and arranged across the display region, wherein the sealing layer includes a first organic insulation layer and a second organic insulation layer, a film thickness of the first organic insulation layer is more than a film thickness of the second organic insulation layer in the planar region, a film thickness of the second organic insulation layer is more than a film thickness of the first organic insulation layer in the curved region, and a hardness of the second organic insulation layer is lower than a hardness of the first organic insulation layer.

DESCRIPTION OF EMBODIMENTS

Figure 1:
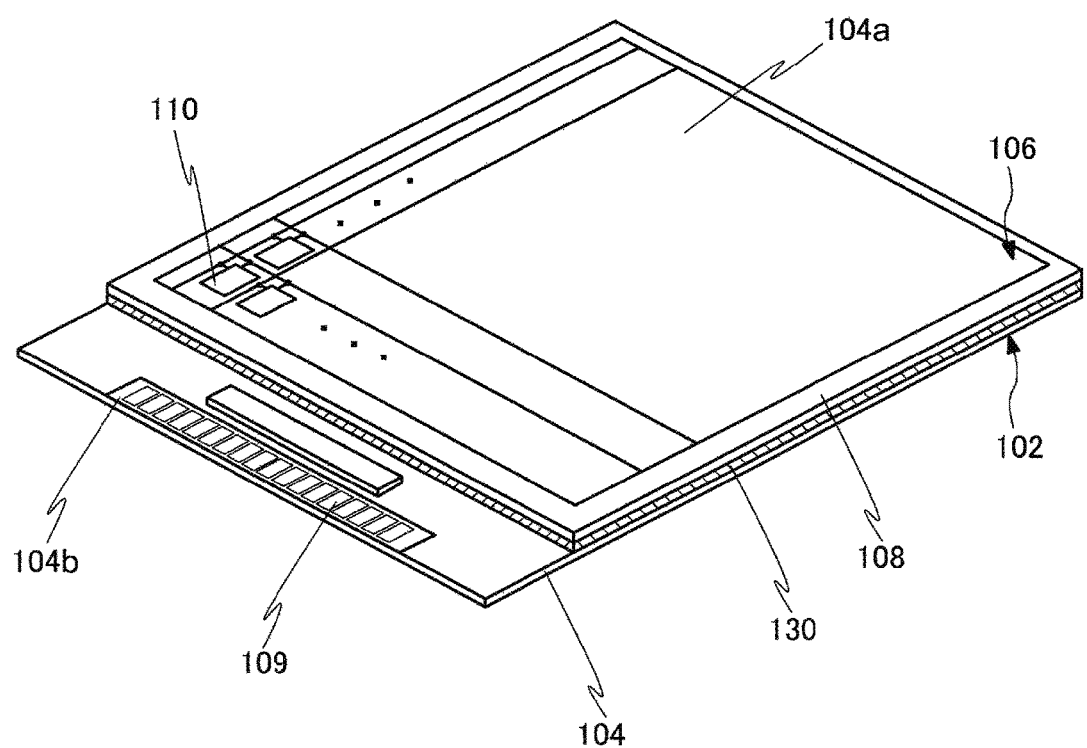
FIG. 1 is a perspective view diagram for explaining a schematic structure of a display device related to one embodiment of the present invention.

The display device related to a number of embodiments of the present invention is explained in detail below while referring to FIG. 1 to FIG. 5D. Furthermore, the display device of the present invention is not limited to the embodiments below and it is possible to perform the present invention using various modifications. In all the embodiments, the same reference symbols are attached to the same structural elements. In addition, the dimension ratios in the drawings are different from actual ratios form for the purposes of explanation, and therefore a part of the structure may be omitted from the drawings.

First Embodiment

<External Structure>

FIG. 1 is a perspective view diagram for explaining an external structure of a display device 100 related to the present embodiment. An external structure of the display device 100 related to the present embodiment is explained using FIG. 1.

The display device 100 related to the present embodiment includes an array substrate 102 arranged with a pixel circuit or light emitting element, an opposing substrate 106 and a plurality of connection terminals 109.

The array substrate 102 includes at least a first substrate 104 and a plurality of pixels 110.

The first substrate 104 includes flexibility. Although a specific material is discussed below, a resin material is used for example as the material of a substrate including flexibility. A display region 104a and terminal region 104b are arranged above the first substrate 104.

The plurality of pixels 110 is arranged within the display region 104a of the first substrate 104. In the present embodiment, the plurality of pixels 110 is arranged in a matrix shape. Although not shown in FIG. 1, each of the plurality of pixels 110 is formed from a pixel circuit including at least a selection transistor, a drive transistor and a light emitting element.

The opposing substrate 106 includes at least a second substrate 108.

The second substrate 108 includes flexibility. It is possible to use the same substrate as the first substrate 104 as the substrate including flexibility. The second substrate 108 is arranged so as to oppose to the first substrate 104 on the upper surface of the display region 104a. The second substrate 108 is fixed to the first substrate 104 by a sealing member 130 which encloses the display region 104a. In the present embodiment, the display region 104a arranged in the first substrate 104 is not exposed to the air since it is covered by the second substrate 108 and sealing member 130. By adopting this structure, degradation of a light emitting element included in each of the plurality of pixels 110 is suppressed.

The opposing substrate 106 may further include a color filter, a light blocking layer, a polarization plate and a phase plate and the like. In addition, the opposing substrate 106 may also be a polarization plate or touch panel. In this case, although it is difficult to completely block water, since a sealing layer described herein is present, it is possible to prevent the infiltration of water to a pixel.

A color filter is arranged at a position corresponding to each of the plurality of pixels 110. A light blocking layer (also called a black matrix) is arranged at a position which defines each of the plurality of pixels 110.

A polarization plate and phase plate are arranged on the side of the opposing substrate 106 covering the plurality of pixels 110. The polarization plate and phase plate are arranged to suppress degradation of visibility due to external light irradiated to the display device 100 being reflected by a pixel electrode.

The plurality of connection terminals 109 is arranged within the terminal region 104b. A plurality of terminal regions 104b forms one end part of the first substrate 104 and is arranged on the outer side of the second substrate 108. A wiring substrate (not shown in the diagram) for connecting devices which output a video signal or a power supply and the like with the display device 100 is arranged in the plurality of connection terminals 109. A connection point between the wiring substrate and the plurality of connection terminals 109 is exposed to the exterior.

An external structure of the display device 100 related to the present embodiment was explained above. Next, a detailed structure of the display device 100 related to the present embodiment is explained while referring to FIG. 2A to 3B.

Figure 2A:
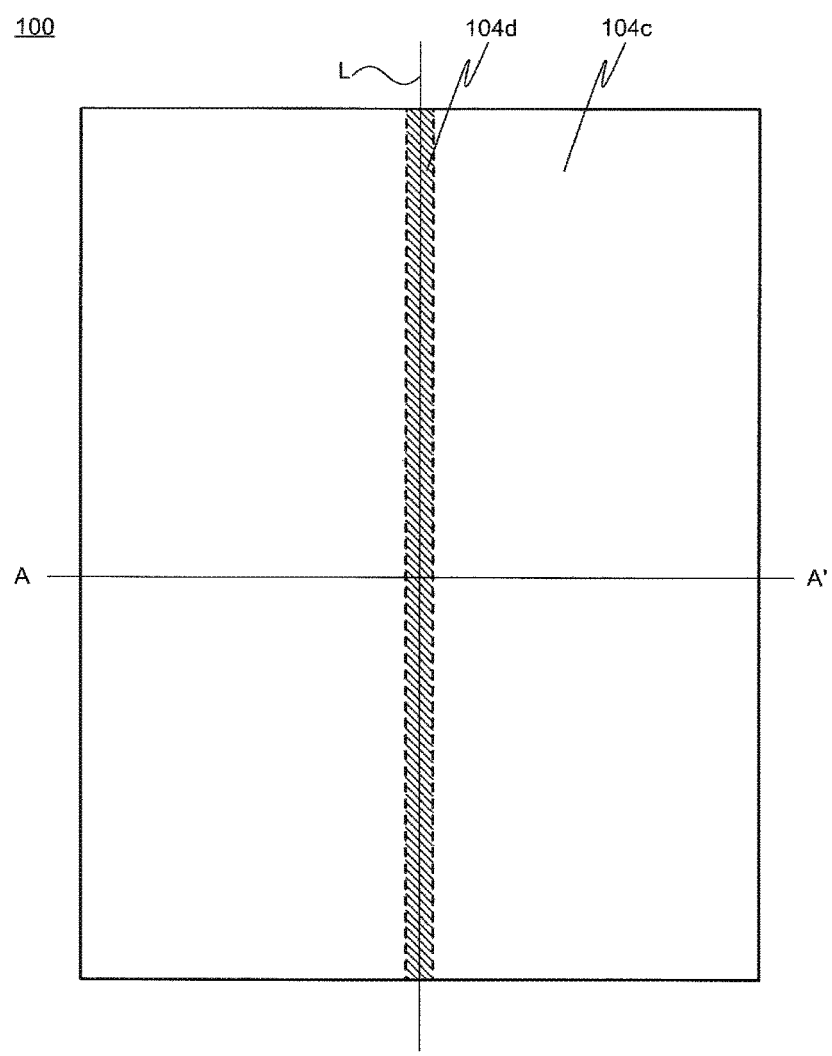
FIG. 2A is a planar view diagram for explaining a schematic structure of a display device related to one embodiment of the present invention.
Figure 2B:
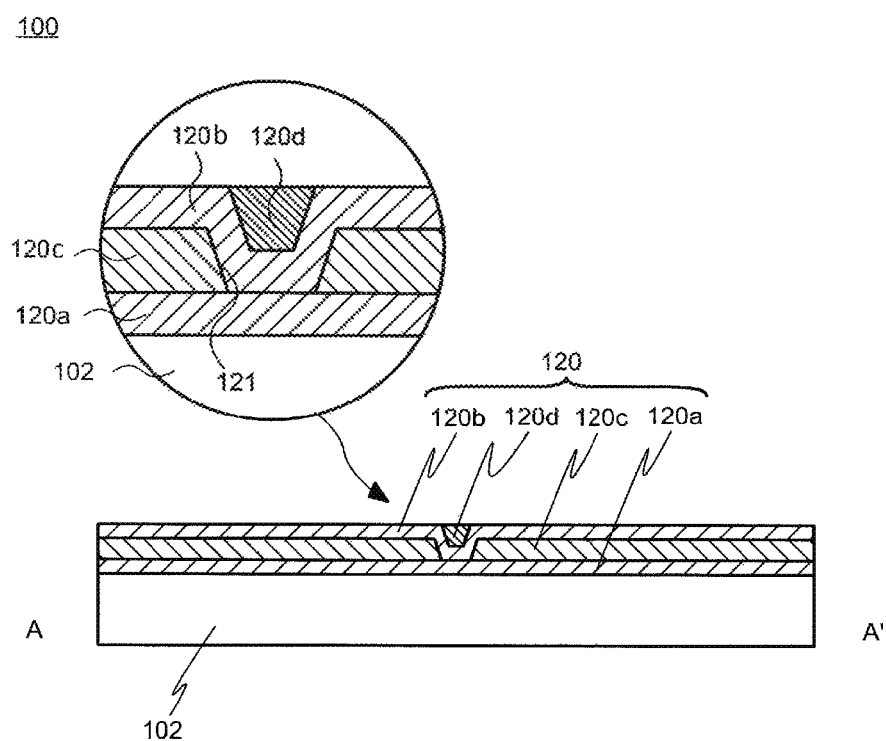
FIG. 2B is a cross-sectional diagram for explaining a schematic structure of a display device related to one embodiment of the present invention.
Figure 3A:
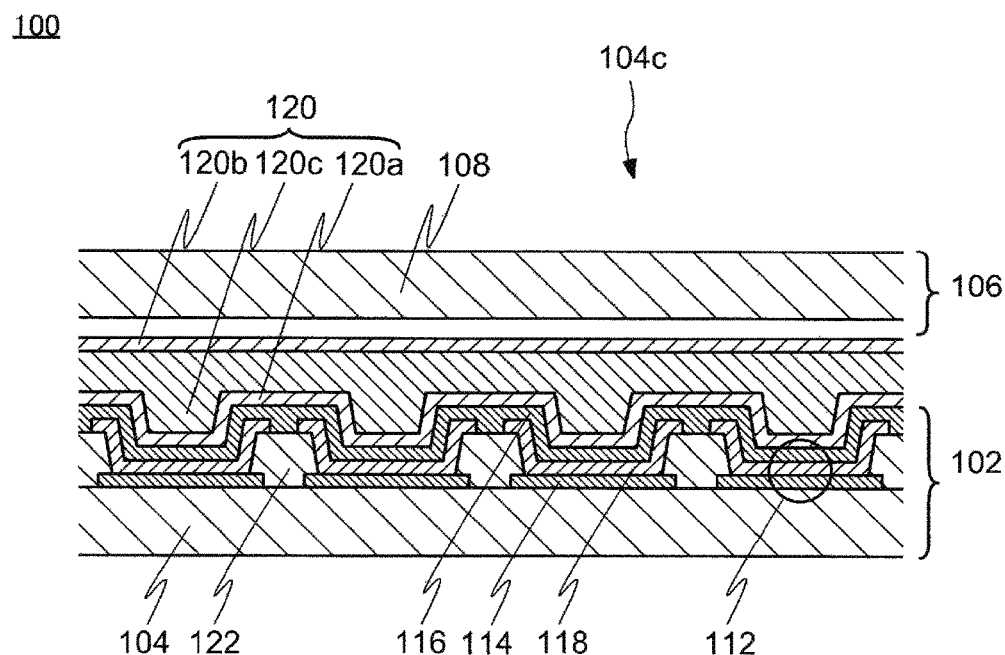
FIG. 3A is an expanded cross-sectional diagram for explaining a structure of a display device related to one embodiment of the present invention.
Figure 3B:
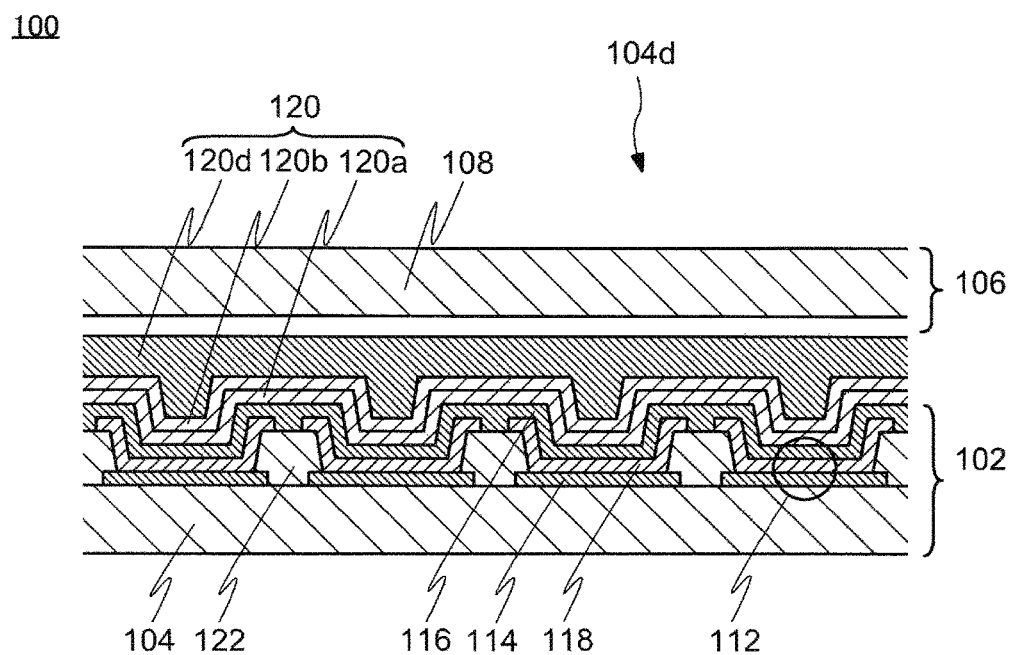
FIG. 3B is an expanded cross-sectional diagram for explaining a structure of a display device related to one embodiment of the present invention.

FIG. 2A is a planar view diagram for explaining a schematic structure of the display device 100 related to the present embodiment of the present invention. FIG. 2B is a cross-sectional diagram for explaining a schematic structure of the display device 100 related to the present embodiment of the present invention. FIG. 3 is a cross-sectional diagram for explaining a structure of the display device 100 related to the present embodiment of the present invention. FIG. 3A is a cross-sectional diagram of a first region 104c of the display device 100, and FIG. 3B is a cross-sectional diagram of a second region 104d of the display device 100.

The display device 100 related to the present embodiment is arranged with an array substrate 102 and a sealing layer 120.

The array substrate 102 includes the first substrate 104 and the plurality of pixels 110.

The first substrate 104 includes a display region 104a and a terminal region 104b. In the present embodiment, a substrate having flexibility is used for the first substrate 104. A resin material is used as a substrate having flexibility. It is preferred to use a high molecular material including an imide bond at repeating units as the resin material, for example, polyimide may be used. Specifically, a film substrate obtained by forming polyimide into a sheet shape is used as the first substrate 104. In this way, the array substrate 102 has flexibility as a whole.

The display region 104a includes a first region 104c and a second region 104d.

The first region 104c is a region where is not assumed that the display device 100 will bend within the display region 104a. The first region 104c is the region except the second region 104d. Although it is not assumed that the first region 104c will bend, the vicinity of a boundary with the second region 104d in the first region 104c may sometimes bends together with bending of the second region 104d.

The second region 104d is a region where is assumed that the display device 100 will bend within the display region 104a. In the present embodiment, the second region 104d is arranged along a straight line L in a vertical direction passing through almost the center of the display region 104a. The second region 104d is arranged in one straight line shape having a certain width.

The width of the second region 104d is preferably 0.5 mm or more and 2.0 mm or less. When the width of the second region 104d is smaller than this range, resistance to a bend formed with the second region 104d as an axis deteriorates, and cracks sometimes occur in the sealing layer 120 particularly near the second region 104d. On the other hand, when the width of the second region 104d is larger than this range, within the sealing layer 120 formed by the first inorganic insulation layer 120a, first organic insulation layer 120c and second inorganic insulation layer 120b, a region covered by the first organic insulation layer 120c contracts and sealing capabilities decrease. That is, in the case where a lower layer side of the first inorganic insulation layer 120a or first organic insulation layer 120c is contaminated by foreign objects, a region arranged with the first organic insulation layer 120c, which has excellent step covering properties compared to the first inorganic insulation layer 120a and second inorganic insulation layer 120b, contracts and thereby the possibility of defects occurring in the sealing layer 120 increases which leads to a decrease in sealing capabilities.

Each of the plurality of pixels 110 is arranged in the display region 104a above the first substrate 104. Each of the plurality of pixels 110 is formed from a pixel circuit including at least a selection transistor (not shown in the diagram), a drive transistor (not shown in the diagram) and a light emitting element 112.

It is possible to use a self-light emitting type of light emitting element as the light emitting element 112, for example it is possible to use an organic EL light emitting element. An organic EL light emitting element includes a common electrode 116 and a light emitting layer 118.

A pixel electrode 114 is arranged corresponding to each of the plurality of pixels. It is preferred to include a metal layer with high reflectance for reflecting light emitted by the light emitting layer 118 to the side of the common electrode 116 as the material of the pixel electrode 114. It is possible to use silver (Ag) for example as the metal layer with high reflectance.

Furthermore, a transparent conductive layer may also be stacked in addition to a metal layer with high reflectance mentioned above. It is preferred to use ITO (indium tin oxide) or IZO (indium zinc oxide) having translucency and conductivity as the transparent conductive layer. In addition, an arbitrary combination of these may also be used.

The common electrode 116 is arranged across the plurality of pixels 110. It is preferred to use ITO (indium tin oxide) or IZO (indium zinc oxide) having translucency and conductivity as the material of the common electrode 116 in order to allow light emitting by the light emitting layer 118 to pass through. Alternatively, a metal layer having a film thickness that will allow an emitted light to pass through may also be used as the common electrode 116.

The light emitting layer 118 is arranged sandwiched between the pixel electrode 114 and common electrode 116. An organic EL material which emits light when a current is supplied is used as the material of the light emitting layer 118. It is possible to use a low molecular or high molecular material as the organic EL material. In the case where a low molecular organic material is used, in addition to an organic material with light emitting properties, the light emitting layer 118 may be formed including a hole injection layer and electron injection layer and also a hole transport layer and electron injection layer so that the organic material with light emitting properties is sandwiched.

A bank 122 is arranged between two adjacent pixels 110. The bank 122 is arranged so as to cover a periphery edge part of the pixel electrode 114.

It is preferred to use an insulation material as the material of the bank 122. It is possible to use an inorganic insulation material or an organic insulation material as the insulation material. It is possible to use silicon oxide, silicon nitride or a combination of these for example as the inorganic insulation material. It is possible to use a polyimide resin, acrylic resin or a combination of these for example as the organic insulation material. A combination of an inorganic insulation material and organic insulation material may also be used.

By arranging the bank 122 formed by an insulation material, it is possible to prevent short circuits between a common electrode 116 and pixel electrode 114 in an end part of the pixel electrode 114. Furthermore, it is possible to securely insulate adjacent pixels 110.

The sealing layer 120 is arranged across the display region 104a and covers the plurality of pixels 110.

In the present embodiment, the sealing layer 120 includes the first inorganic insulation layer 120a, second inorganic insulation layer 120b, first organic insulation layer 120c and second organic insulation layer 120d. Here, the layer structure of the sealing layer 120 is different between the first region 104c and second region 104d. These layers which form the sealing layer 120 are stacked from the bottom layer in the order first inorganic insulation layer 120a, first organic insulation layer 120c, second inorganic insulation layer 120b and second organic insulation layer 120d. These layers are explained in order from the layer on the bottom layer side.

The first inorganic insulation layer 120a is arranged on the lowest layer in the sealing layer 120. It is preferred to use an insulation material with low moisture permeability as the material of the first inorganic insulation layer 120a. In the present embodiment, silicon nitride is used as the material of the first inorganic insulation layer 120a.

The first organic insulation layer 120c is arranged above the first inorganic insulation layer 120a. The first organic insulation layer 120c is arranged in a region except the second region 104d. In other words, the first organic insulation layer 120c includes an aperture part 121 across the second region 104d. In the present embodiment, the aperture part 121 passes through the first organic insulation layer 120c.

In addition, in the present embodiment, a side wall of the aperture part 121 has a taper shape. That is, among the angles formed by the bottom surface of the first organic insulation layer 120c and the aperture part 121, an angle on the interior side of the first organic insulation layer 120c is a sharp angle. By providing such a structure, the covering properties of the second inorganic insulation layer 120b arranged above the first organic insulation layer 120c become good. In this way, it is difficult for cracks to occur in the second inorganic insulation layer 120b when bent.

It is preferred to use a material with low moisture permeability as the material of the first organic insulation layer 120c. Specifically, it is preferred to be formed with a material and film thickness so that moisture permeability becomes 60 mg/m$^2$/day or less for example. In addition, a material a glass transition temperature Tg of 60° C. or higher is preferred. In addition, an insulation material which can planarize unevenness caused by plurality of light emitting elements 112 or a bank 122 arranged on a lower layer is preferred. When such unevenness is present, the covering properties of the first inorganic insulation layer 120a are insufficient and a propagation of water to the first inorganic insulation layer 120a may be produced. In the present embodiment, an epoxy resin is used as the material of the first organic insulation layer 120c.

The second inorganic insulation layer 120b is arranged above the first organic insulation layer 120c. The second inorganic insulation layer 120b covers an aperture part of the first organic insulation layer 120c. That is, the second inorganic insulation layer 120b is arranged at a top surface of the first organic insulation layer 120c, a side wall and bottom part of the aperture part. The second inorganic insulation layer 120b and first inorganic insulation layer 120a contact in the bottom part of the aperture part. That is, the first inorganic insulation layer 120a and second inorganic insulation layer 120b sandwich at least the first organic insulation layer 120c.

An insulation material with low moisture permeability is preferred as the material of the second inorganic insulation layer 120b. Since an organic insulation material easily allows the formation of an infiltration path for water, when water infiltrates to the first organic insulation layer 120c, there is concern that the water may reach the first inorganic insulation layer 120a and further infiltrate to the light emitting layer 118. Since the first organic insulation layer 120c which uses an epoxy resin has a high degree of flatness, the second inorganic insulation layer 120b has excellent covering properties which makes it difficult for a water propagation path to occur. In the present embodiment, silicon nitride is used as the material of the first inorganic insulation layer 120a.

The second organic insulation layer 120d is arranged above the first inorganic insulation layer 120a and second inorganic insulation layer 120b in at least the second region 104d. That is, the second organic insulation layer 120d is arranged across at least the aperture part. In the present embodiment, the second organic insulation layer 120d is arranged so as to fill the aperture part covered by the second inorganic insulation layer 120b.

It is sufficient that second organic insulation layer 120d have a hardness equal to or less than the hardness of the first organic insulation layer 120c. Preferably, the hardness of the second organic insulation layer 120d is lower than the hardness of the first organic insulation layer 120c. That is, the second organic insulation layer 120d is preferably more flexible than the first organic insulation layer 120c. Here, there are many types of calculation method of hardness, for example, the hardness of the second organic insulation layer 120d may be less than the hardness of the first organic insulation layer 120c measured by any one of the following calculation methods: Brinell hardness, Vickers hardness, Knoop hardness, Rockwell hardness, Superficial hardness, Meyer hardness, durometer hardness, Barcol hardness, Monotron hardness, Martens hardness, Shore hardness and Mohs hardness and the like.

It is preferred that the second organic insulation layer 120d have a hardness of 50 or less measured by a durometer for example.

In addition, there a many types of property value which indicate hardness, and for example, the hardness of the second organic insulation layer 120d may be less than the hardness of the first organic insulation layer 120c in any one of a property value including a Young's modulus, rigidity ratio and Poisson's ratio and the like.

An insulation material with high flexibility is preferred as the material of the second organic insulation layer 120d. Specifically, a material with a glass transition temperature Tg of 30° C. or less for example is preferred. In the present embodiment, an acrylic resin is used as the material of the second organic insulation layer 120d.

By providing the display device of the present invention with such a structure, flexibility of the second region 104d is improved when the display device is bent. As a result, it is difficult for cracks to occur in the sealing layer 120 in the second region 104d during bending. Furthermore, since the area taken up by the flexible second region 104 is narrowly limited, it is possible to suppress degradation of sealing capabilities of the entire display device 100. That is, it is possible to improve resistance to bending while continuing to maintain sealing capabilities.

A structure of the display device 100 related to the present embodiment was explained above. It is possible to provide a display device 100 which displays high reliability since it is difficult for cracks to occur in a sealing layer 120 when the display device 100 related to the present embodiment is bent.

Furthermore, although described in detail in other embodiments, the layer structure and plane structure of the sealing layer 120 related to the present invention are not limited to those explained in the present embodiment.

For example, the aperture part 121 may have a shape (bottomed) including a bottom. In addition, the second organic insulation layer 120d may fill the aperture part 121 in the second region and may be arranged across the entire surface of the display region 104a.

Furthermore, in the present embodiment, the second organic insulation layer 120d is not arranged in the first region 104c and the first organic insulation layer 120c is not arranged in the second region 104d. In other words, the film thickness of the second organic insulation layer 120d in the first region 104c is 0 μm and the film thickness of the first organic insulation layer 120c in the second region 104d is 0 μm.

In the case where the first organic insulation layer 120c is arranged in the second region 104d, the film thickness of the first organic insulation layer 120c in the second region 104d is preferred to be 10 μm or less. When the film thickness of the first organic insulation layer 120c in the second region 104d is larger than this range, resistance to bending when the second region 104d is an axis deteriorates, and cracks may occur in the sealing layer 120 particularly in the vicinity of the second region 104d.

In the case where the second organic insulation layer 120d is arranged in the first region 104c, the film thickness of the second organic insulation layer 120d in the first region 104c is preferred to be 10 μm or less. When the film thickness of the second organic insulation layer 120d in the first region 104c is larger than this range, translucency of the sealing layer 120 with respect to visible light deteriorates, and visibility of the display device deteriorates.

A number of modified examples related to the structure of the sealing layer 120 which meet the conditions described above are explained below. In the explanation of the modified examples below, an explanation is provided by dividing into a modified example related to a plane structure and a modified example related to a layer structure.

Modified Example Related to a Plane Structure

Figure 4A:
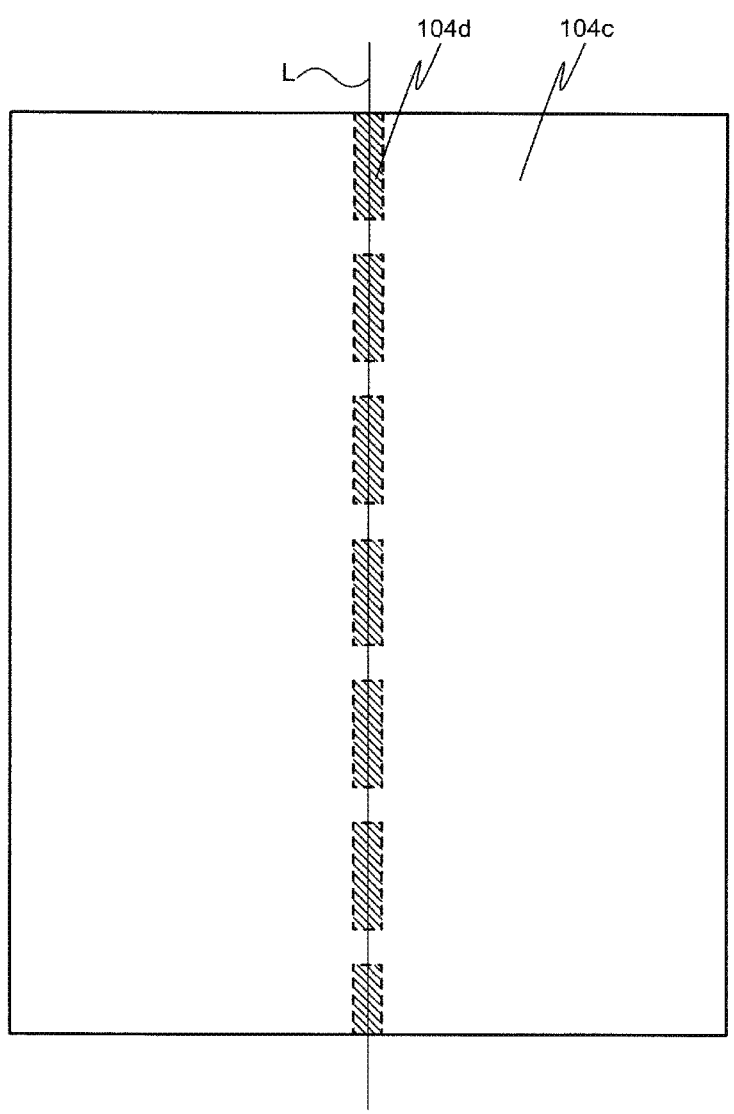
FIG. 4A is a planar view diagram for explaining a structure of a modified example of a display device related to one embodiment of the present invention.
Figure 4B:
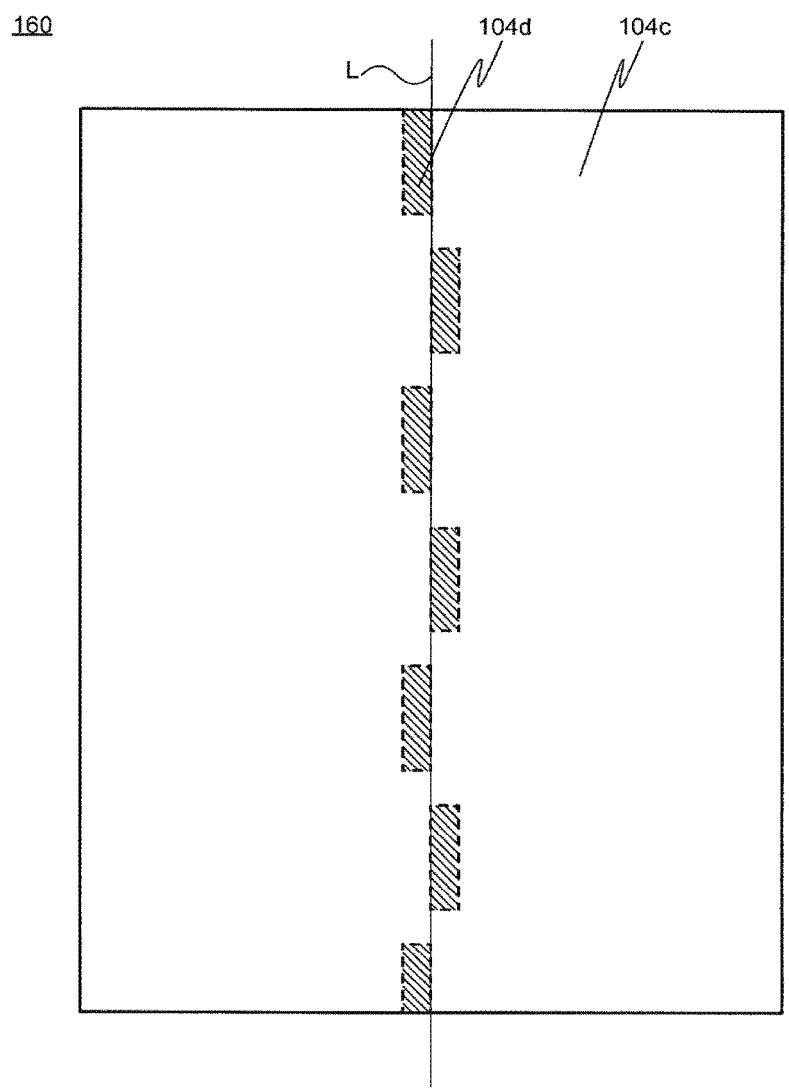
FIG. 4B is a planar view diagram for explaining a structure of a modified example of a display device related to one embodiment of the present invention.
Figure 4C:
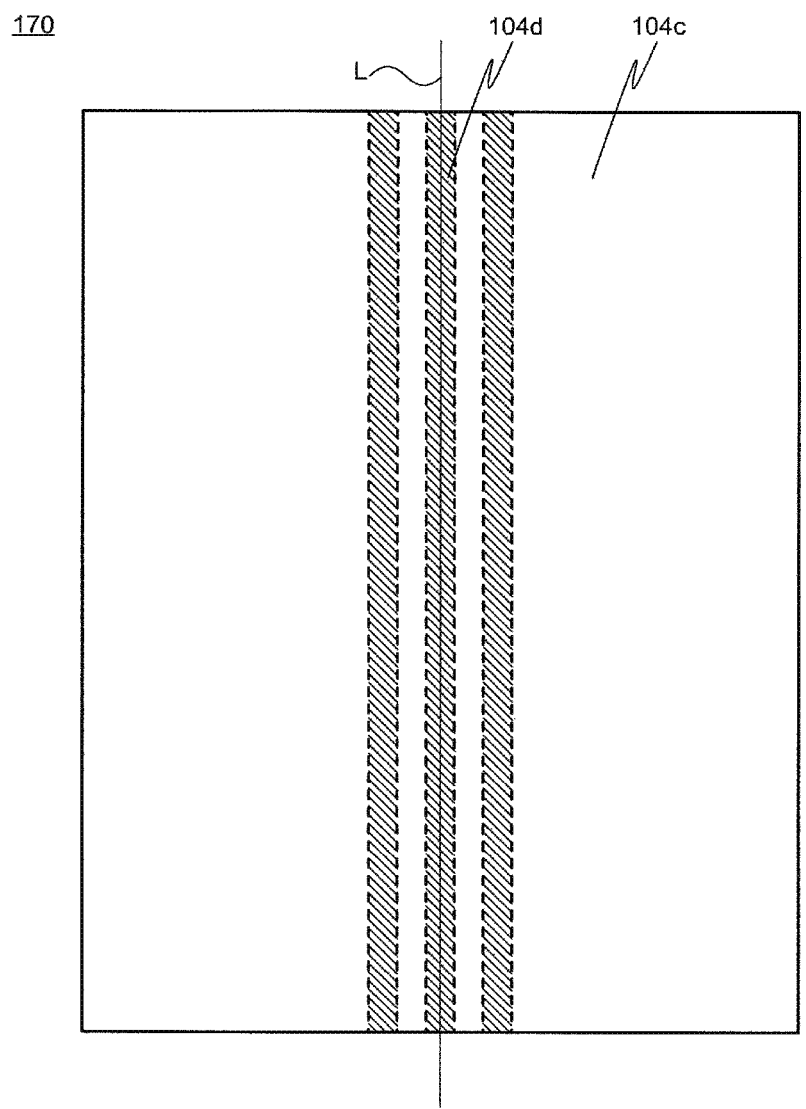
FIG. 4C is a planar view diagram for explaining a structure of a modified example of a display device related to one embodiment of the present invention.

A number of modified examples related to a plane structure in particular of the sealing layer 120 of the display device 100 related to the present embodiment are explained while referring to FIG. 4A to FIG. 4C.

Each of the diagrams FIG. 4A to FIG. 4C explain a number of modified examples related to a plane structure of the sealing layer 120 of the display device related to the present embodiment. Furthermore, the layer structure of the display device related to these modified examples is explained as substantially equal to a cross-sectional structure of the display device 100 related to the first embodiment.

When a display device 150 related to the present modified example shown in FIG. 4A is compared with the display device 100 related to the present embodiment, only the layout of the second region 104d arranged along a straight line L is different. In the display device 150 related to the present modified example, the second region 104d is arranged in a dashed line along the straight line L. In other words, the second region 104d is arranged in a plurality of island shapes and this plurality of islands is arranged along the straight line L.

Resistance to bending of the display device 150 when the straight line L is an axis is improved even with such a structure. Furthermore, by providing such a structure it is possible to reduce the material used in the second organic insulation layer 120d. In this way, it is possible to reduce manufacturing costs.

When a display device 160 related to the present modified example shown in FIG. 4B is compared with the display device 150 related to the present modified example, only the layout of the second region 104*d* arranged along a straight line L is different. In the display device 160 related to the present modified example, the second region 104*d* is arranged in a plurality of island shapes. Among the plurality of islands, mutually adjacent islands are arranged on mutual opposite sides with respect to the straight line L.

Resistance to bending of the display device when the straight line L is an axis is improved even with such a structure.

When a display device 170 related to the present modified example shown in FIG. 4C is compared with the display device 100 related to the present embodiment, only the layout of the second region 104*d* arranged along a straight line L is different. That is, the number of second regions 104*d* is different. In the present modified example, three second regions 104*d* are arranged extending in a vertical direction of the display region 104*a*.

Furthermore, the number of second regions 104*d* is not limited to this example, and may be two or four or more. In addition, each of the plurality of second regions 104*d* is not limited to this example, and may be a dashed line shape for example.

Resistance to bending of the display device 170 when the straight line L is an axis is improved even with such a structure. Furthermore, by providing such a structure, stress applied to the display device 170 when bent is dispersed to the plurality of second regions 104*d*. In this way, it is difficult for cracks to occur when bent and it is possible to provide the display device 170 with more improved reliability.

Modified Example Related to a Layer Structure

A number of modified examples related to a layer structure in particular of the sealing layer 120 of the display device 100 related to the present embodiment are explained while referring to FIG. 5A to FIG. 5D.

Each of the diagrams FIG. 5A to FIG. 5D explain a number of modified examples related to a layer structure of the sealing layer 120 of the display device related to the present embodiment. Furthermore, the plane structure of the display device related to these modified examples is explained as substantially equal to a plane structure of the display device 100 related to the first embodiment.

Figure 5A:
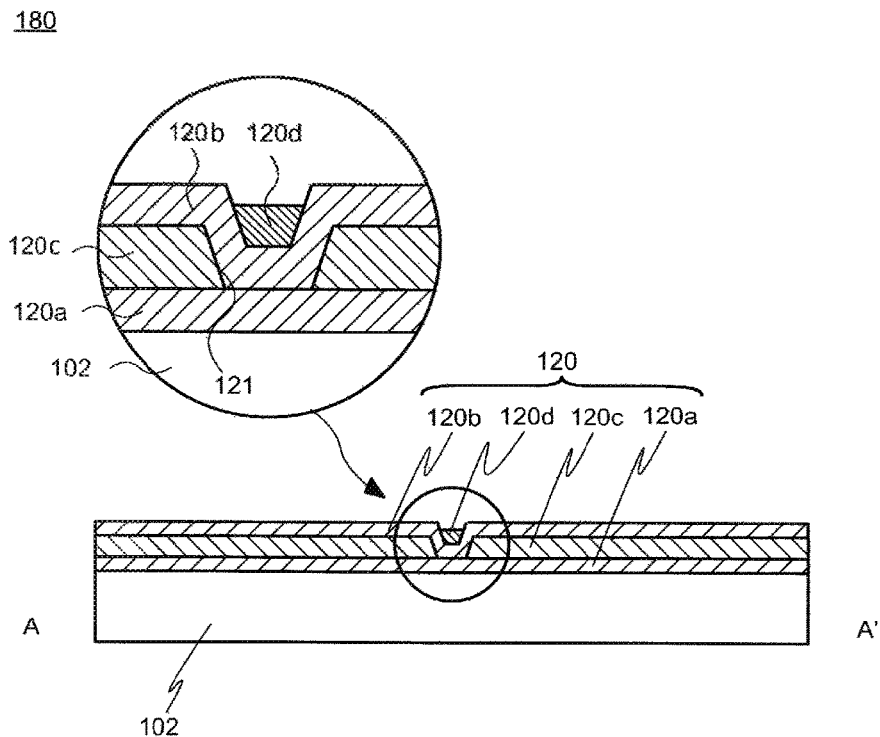
FIG. 5A is a cross-sectional diagram for explaining a structure of a modified example of a display device related to one embodiment of the present invention.

When a display device 180 related to the present modified example shown in FIG. 5A is compared with the display device 100 related to the present embodiment, only the structure of the second organic insulation layer 120*d* is different. That is, the second organic insulation layer 120*d* in the display device 180 related to the present modified example is not filled up to an aperture edge of the aperture part 121 and only a part of the aperture part 121 is filled. In other words, the film thickness of the second organic insulation layer 120*d* is smaller than the film thickness of the first organic insulation layer 120*c*.

By providing such a structure, it is possible to reduce the material of the second organic insulation layer 120*d* to be used. In this way, it is possible to reduce the manufacturing cost of the display device 180.

Figure 5B:
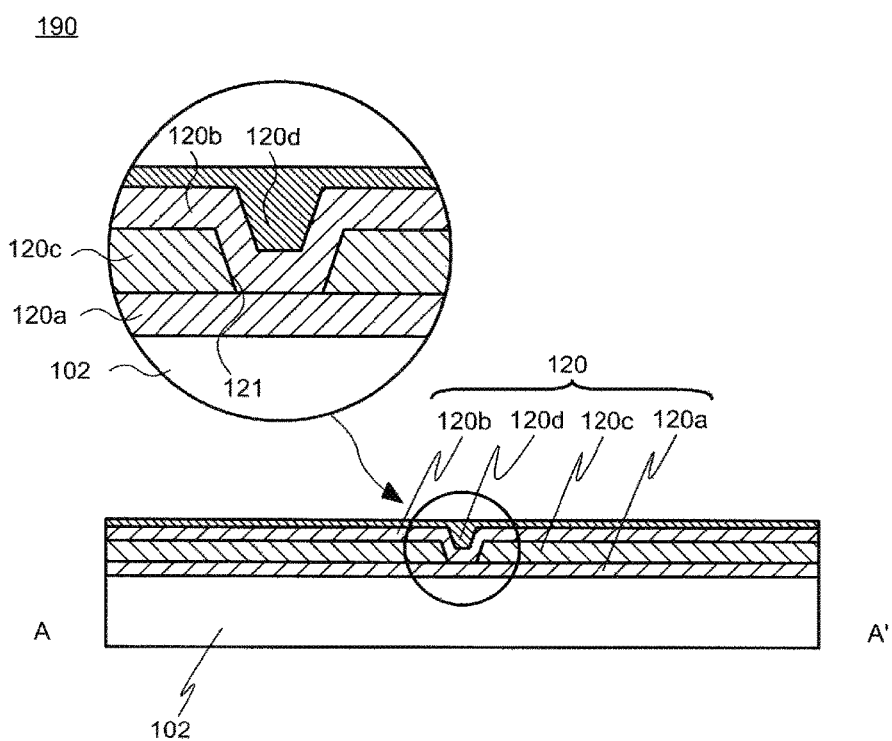
FIG. 5B is a cross-sectional diagram for explaining a structure of a modified example of a display device related to one embodiment of the present invention.

When a display device 190 related to the present modified example shown in FIG. 5B is compared with the display device 100 related to the present embodiment, only the structure of the second organic insulation layer 120*d* is different. That is, the second organic insulation layer 120*d* in the display device 190 related to the present modified example fills the aperture part 121 and is arranged across the display region 104*a*.

By providing such a structure, it is possible to omit patterning the second organic insulation layer 120*d*. In this way, the manufacturing process of the display device is simplified and it is possible to reduce manufacturing costs.

Figure 5C:
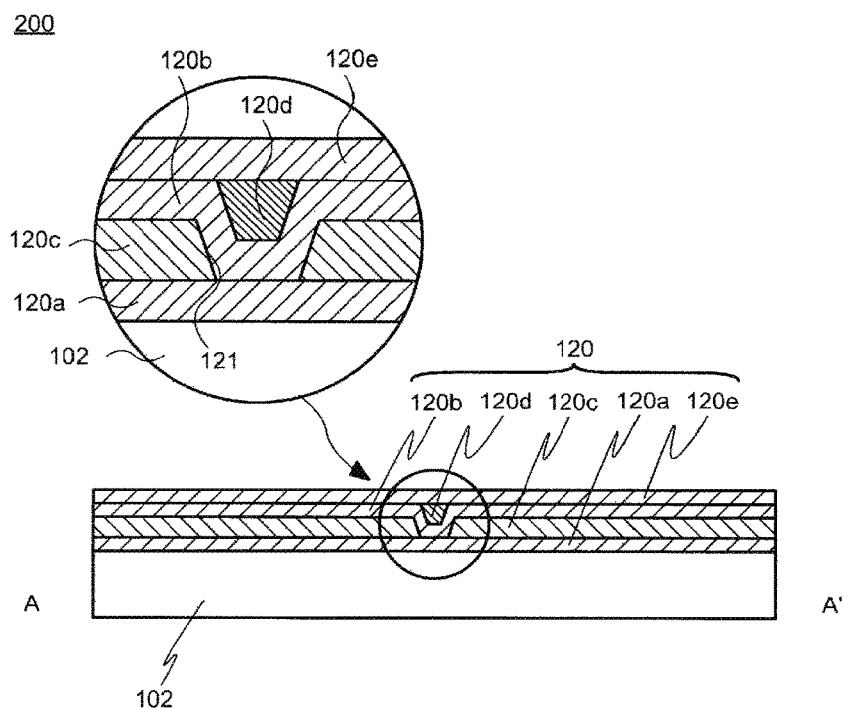
FIG. 5C is a cross-sectional diagram for explaining a structure of a modified example of a display device related to one embodiment of the present invention.

When a display device 200 related to the present modified example shown in FIG. 5C is compared with the display device 100 related to the present embodiment, only the point that a third inorganic insulation layer 120*e* is provided is different. The third inorganic insulation layer 120*e* is arranged across the display region 104*a* and above the second organic insulation layer 120*d*. That is, the third inorganic insulation layer 120*e* is arranged on the uppermost layer of the sealing layer 120.

By providing such a structure, moisture permeability of the sealing layer 120 as a whole is further reduced and it is possible to provide the display device 200 with improved reliability.

In addition, although not shown in the diagrams, the third inorganic insulation layer 120*e* related to the present modified example may be combined with the display device 200 related to the present modified example. That is, since the second organic insulation layer 120*d* arranged across the display region 104*a* has a high level of flatness including the first region 104*c* and second region 104*d*, it is even more difficult for cracks to occur in the third inorganic insulation layer 120*e* covering the second organic insulation layer 120*d*. In this way, moisture permeability of the sealing layer 120 as a whole is further reduced and it is possible to provide the display device 200 with improved reliability.

Figure 5D:
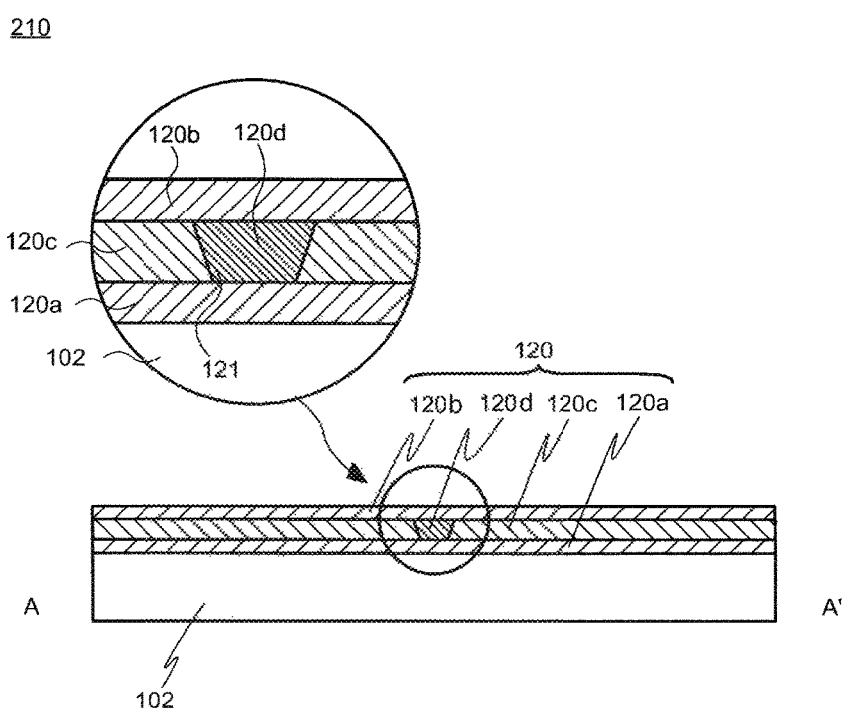
FIG. 5D is a cross-sectional diagram for explaining a structure of a modified example of a display device related to one embodiment of the present invention.

When a display device 210 related to the present modified example shown in FIG. 5D is compared with the display device 100 related to the present embodiment, the structure of the second inorganic insulation layer 120*b* and second organic insulation layer 120*d* is different. That is, the second inorganic insulation layer 120*b* does not cover a side wall of an aperture part passing through the first organic insulation layer 120*c*. At the same time, the second organic insulation layer 120*d* contacts the second inorganic insulation layer 120*b*. That is, the second organic insulation layer 120*d* fills the aperture part passing through the first organic insulation layer 120*c*. In addition, the second inorganic insulation layer 120*b* covers the first organic insulation layer 120*c* and the second organic insulation layer 120*d*

By providing such a structure, since flatness of a lower layer of the second inorganic insulation layer 120*b* is improved, it is difficult for cracks to occur in the second inorganic insulation layer 120*b*. In this way, moisture permeability of the sealing layer 120 as a whole is further reduced and it is possible to provide the display device 210 with improved reliability.

A number of modified examples of the display device related to the present embodiment were explained above. Furthermore, needless to say, it is possible to arbitrarily combine one modified example of three modified examples related to a plane structure and one modified example of four modified examples related to a layer structure.

The preferred embodiments of the present invention were explained above. However, these embodiments are merely examples and the technical scope of the present invention is not limited these embodiments. Various modifications may be made by persons ordinarily skilled in the art that do not depart from the main concept of the present invention and these modifications should also be interpreted as belonging to the technical scope of the present invention.

EXPLANATION OF THE REFERENCE SYMBOLS

Display device 100, 150, 160, 180, 190, 200, Array substrate 102, First substrate 104, Opposing substrate 106, Second substrate 108, Connection terminal 109, Pixel 110, Light emitting element 112, Pixel electrode 114, Common electrode 116, Light emitting layer 118, Sealing layer 120, First inorganic insulation layer 120a, Second inorganic insulation layer 120b, First organic insulation layer 120c, Second organic insulation layer 120d, Third inorganic insulation layer 120e, Bank 122, Sealing member 130

What is claimed is:

1. A display device comprising:
an array substrate including a plurality of pixels arranged in a display region, the display region including a first region and a second region arranged only around a center line of the display region; and
a sealing layer covering the plurality of pixels and arranged across the display region;
wherein
the sealing layer of the first region includes a first inorganic insulation layer, a first organic insulation layer, and a second inorganic insulation layer sequentially stacked in that order from the array substrate,
the sealing layer of the second region includes the first inorganic insulation layer, the second inorganic insulation layer, and a second organic insulation layer sequentially stacked in that order from the array substrate,
the first organic insulation layer includes an aperture part across the second region, the aperture part forms a concave part in the second region,
the second organic insulation layer is arranged inside the concave part, and does not extend to the first region, and a hardness of the second organic insulation layer is lower than a hardness of the first organic insulation layer, and
the first region is a non-bendable region and the second region is a bendable region.

2. The display device according to claim 1, wherein the hardness is measured by a durometer.

3. The display device according to claim 2, wherein the hardness of the second organic insulation layer is 50 or less on the Shore D hardness scale.

4. The display device according to claim 1, wherein the second region is arranged along a straight line above the display region.

5. The display device according to claim 1, wherein a top surface of the second organic insulation layer of the second region is lower than a top surface of the second inorganic insulation layer of the first region.

6. The display device according to claim 1, wherein
the sealing layer of the first region includes the first inorganic insulation layer, the first organic insulation layer, the second inorganic insulation layer, and a third inorganic insulation layer sequentially stacked in that order from the array substrate, and
the sealing layer of the second region includes the first inorganic insulation layer, the second inorganic insulation layer, the second organic insulation layer, and the third inorganic insulation layer sequentially stacked in that order from the array substrate.

7. The display device according to claim 1, wherein the second region is divided into a plurality of closed regions arranged along a discontinuous straight line above the display region.

8. The display device according to claim 1, wherein the second region is divided into a plurality of closed regions arranged along two discontinuous straight lines above the display region.

9. The display device according to claim 1, wherein the second region is divided into a plurality of closed regions each arranged along a straight line above the display region.

* * * * *